(12) United States Patent  
Isshiki et al.

(10) Patent No.: US 8,783,837 B2  
(45) Date of Patent: Jul. 22, 2014

(54) LIQUID JET HEAD, LIQUID JET APPARATUS, AND PIEZOELECTRIC ELEMENT

(75) Inventors: Tetsuya Isshiki, Shiojiri (JP); Toshiaki Takahashi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/604,410

(22) Filed: Sep. 5, 2012

(65) Prior Publication Data  
US 2013/0093817 A1 Apr. 18, 2013

(30) Foreign Application Priority Data  
Sep. 6, 2011 (JP) .................. 2011-193663

(51) Int. Cl.  
*B41J 2/045* (2006.01)

(52) U.S. Cl.  
USPC .......................................... 347/68

(58) Field of Classification Search  
None  
See application file for complete search history.

(56) References Cited

U.S. PATENT DOCUMENTS

| | | | |
|---|---|---|---|
| 7,586,234 B2 | 9/2009 | Miyazawa et al. | |
| 2006/0152113 A1* | 7/2006 | Nanataki et al. | 310/358 |
| 2007/0241642 A1* | 10/2007 | Miyazawa et al. | 310/358 |

FOREIGN PATENT DOCUMENTS

| | | |
|---|---|---|
| JP | 2001-223404 | 8/2001 |
| JP | 2007-287745 | 11/2007 |
| JP | 2010-053422 | 3/2010 |

* cited by examiner

*Primary Examiner* — Matthew Luu  
*Assistant Examiner* — Erica Lin  
(74) *Attorney, Agent, or Firm* — Workman Nydegger

(57) ABSTRACT

[Object] There are provided a liquid jet head and a liquid jet apparatus that each include a piezoelectric element including a piezoelectric layer in which the occurrence of cracks is suppressed, and the piezoelectric element.

[Solution] The liquid jet head ejects a liquid from a nozzle aperture. The liquid jet head includes a piezoelectric element including a piezoelectric layer and an electrode provided for the piezoelectric layer. The piezoelectric layer is made of a complex oxide containing bismuth, iron, barium and titanium and having a perovskite structure, and has an average crystal grain diameter of 120 nm or more and 252 nm or less.

4 Claims, 10 Drawing Sheets

US 8,783,837 B2

LIQUID JET HEAD, LIQUID JET APPARATUS, AND PIEZOELECTRIC ELEMENT

TECHNICAL FIELD

The entire disclosure of Japanese Patent Application Nos. 2011-193663, filed Sep. 6, 2011, is expressly incorporated by reference herein.

The present invention relates to a liquid jet head and a liquid jet apparatus that each include a piezoelectric element including a piezoelectric layer made of a piezoelectric material and electrodes, and that eject droplets from nozzle apertures, and relates to the piezoelectric element.

BACKGROUND ART

Some of the piezoelectric elements have a structure in which a piezoelectric layer (piezoelectric film) made of a piezoelectric material capable of electromechanical conversion, such as a crystallized dielectric material, is disposed between two electrodes. This type of piezoelectric element is used as a deflection vibration mode actuator device in a liquid jet head. Ink jet recording heads are a typical type of liquid jet head. For example, an ink jet recording head includes a vibration plate defining a part of a pressure generating chamber communicating with nozzle apertures through which ink droplets are ejected. In the ink jet recording head, a piezoelectric element deforms the vibration plate to apply a pressure to the ink in the pressure generating chamber, thereby ejecting ink droplets through the nozzle apertures.

The piezoelectric material used for forming the piezoelectric layer of such a piezoelectric element is required to have high piezoelectric properties, and a typical example of the piezoelectric material is lead zirconate titanate (PZT) (see PTL 1). On the other hand, piezoelectric materials containing no lead or a reduced amount of lead are required from the viewpoint of environmental issues. For example, $BiFeO_3$-based piezoelectric materials, which contain Bi and Fe, are lead-free piezoelectric materials (see, for example, PTL 2).

CITATION LIST

Patent Literature

[PTL 1] JP-A-2001-223404
[PTL 2] JP-A-2007-287745

SUMMARY OF INVENTION

Technical Problem

Piezoelectric materials containing Bi, Ba, Fe and Ti have a problem that piezoelectric layers made of these piezoelectric materials are liable to crack. This problem can arise not only in liquid jet heads, a representative example of which is an ink jet recording head, but also in piezoelectric elements used for other applications.

In view of such circumstances, an object of the invention is to provide a liquid jet head and a liquid jet apparatus that each include a piezoelectric element including a piezoelectric layer in which the occurrence of cracks is suppressed, and to provide the piezoelectric element.

Solution to Problem

According to an aspect of the invention that can solve the above-described problem, a liquid jet head that ejects a liquid from a nozzle aperture is provided. The liquid jet head includes a piezoelectric element including a piezoelectric layer and an electrode provided for the piezoelectric layer. The piezoelectric layer is made of a complex oxide containing bismuth, iron, barium and titanium and having a perovskite structure, and has an average crystal grain diameter of 120 nm or more and 252 nm or less.

In this aspect, in which the piezoelectric layer is made of the complex oxide containing bismuth, iron, barium and titanium and having a perovskite structure, and has an average crystal grain diameter of 120 nm or more and 252 nm or less, cracks in the piezoelectric layer can be suppressed. In addition, since the piezoelectric material does not contain lead or the lead content is reduced, the load to environment can be reduced.

Preferably, the piezoelectric layer is preferentially oriented in the (110) plane. Thus, the occurrence of cracks can be suppressed, and a large amount of distortion can be produced.

According to another aspect of the invention, a liquid jet apparatus including the above-described liquid jet head is provided. In this aspect, since a piezoelectric layer in which the occurrence of cracks is suppressed is used, the liquid jet apparatus is highly reliable.

According to still another aspect of the invention, a piezoelectric element is provided which includes a piezoelectric layer and an electrode provided for the piezoelectric layer. The piezoelectric layer is made of a complex oxide containing bismuth, iron, barium and titanium and having a perovskite structure, and has an average crystal grain diameter of 120 nm or more and 252 nm or less. In this aspect, in which the piezoelectric layer is made of the complex oxide containing bismuth, iron, barium and titanium and having a perovskite structure, and has an average crystal grain diameter of 120 nm or more and 252 nm or less, cracks in the piezoelectric layer can be suppressed. In addition, since the piezoelectric material does not contain lead or the lead content is reduced, the load to environment can be reduced.

BRIEF DESCRIPTION OF DRAWINGS

DESCRIPTION OF EMBODIMENTS (Embodiment 1) FIG. 1 is a schematic exploded perspective view of an ink jet recording head that is an example of the liquid jet head according to Embodiment 1 of the invention. FIG. 2 is a plan view of FIG. 1, and FIG. 3 is a sectional view taken along line A-A' shown in FIG. 2. As shown in FIGS. 1 to 3, a flow channel-forming substrate 10 of the present embodiment is defined by a monocrystalline silicon substrate, and a silicon dioxide elastic film 50 is disposed on one surface of the flow channel-forming substrate 10.

Figure 1:
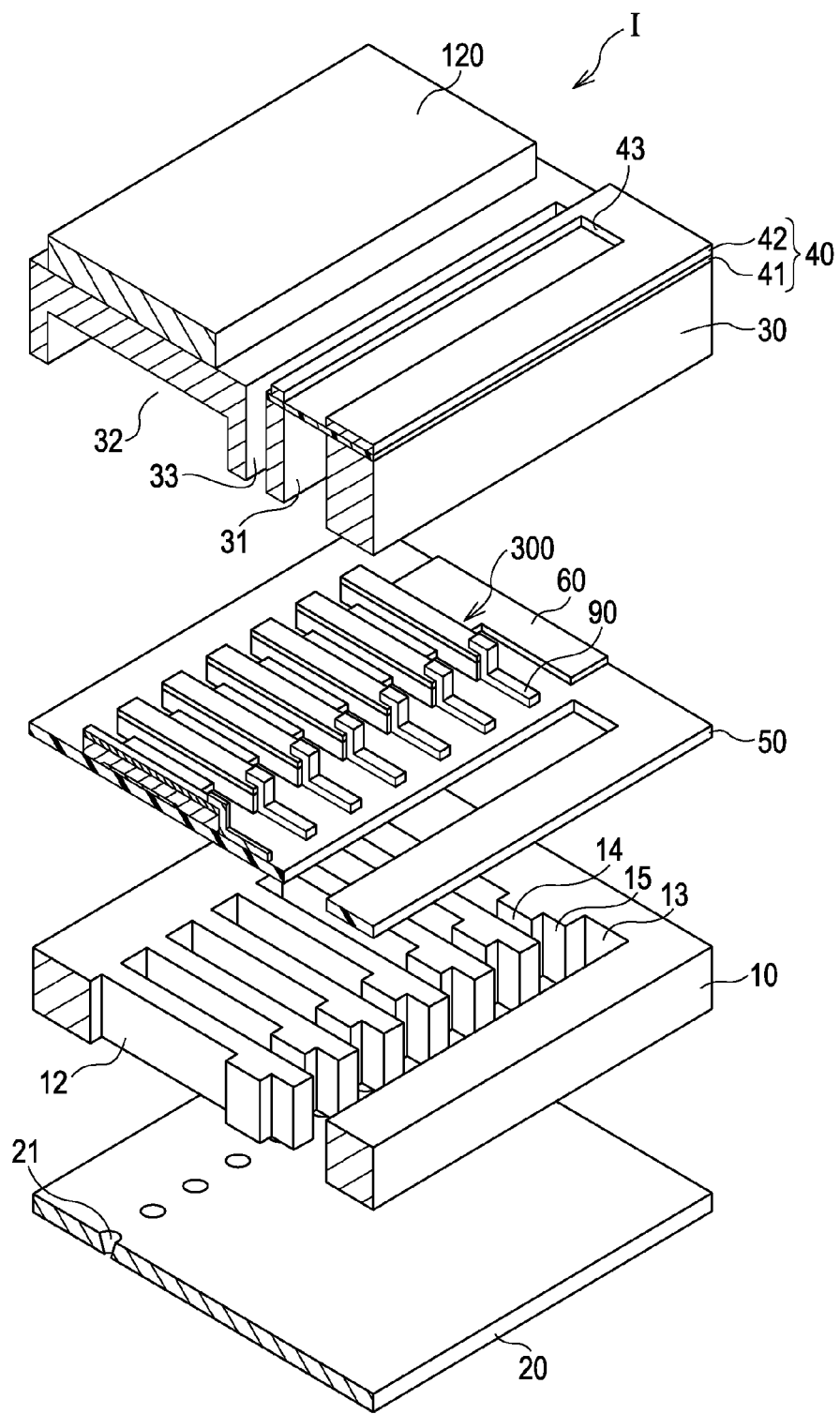
FIG. 1 is a schematic exploded perspective view of a recording head according to Embodiment 1.
Figure 2:
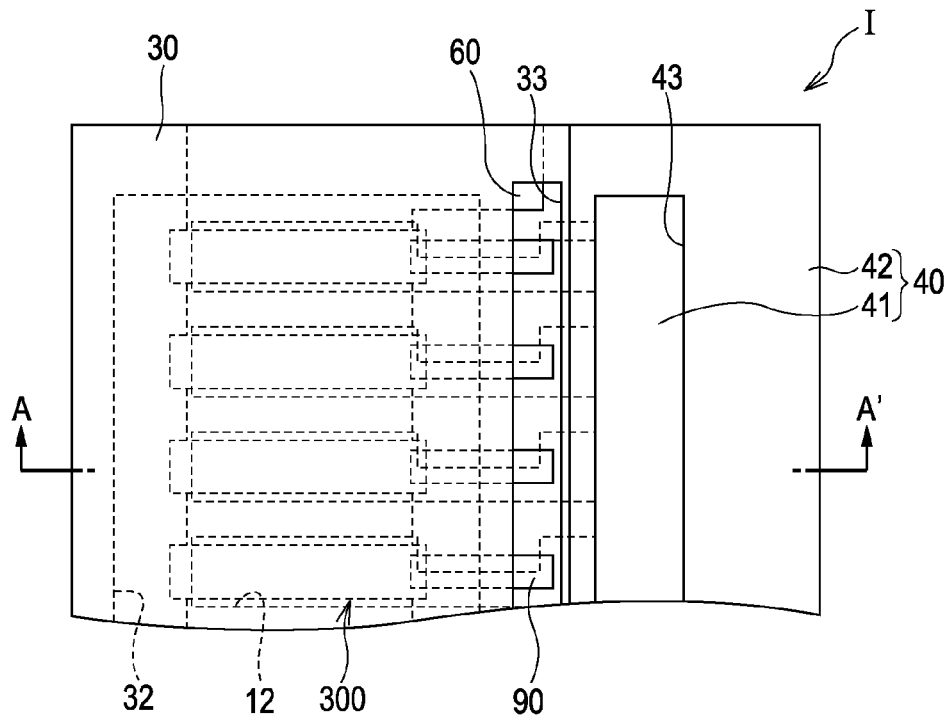
FIG. 2 is a plan view of the recording head according to Embodiment 1.
Figure 3:
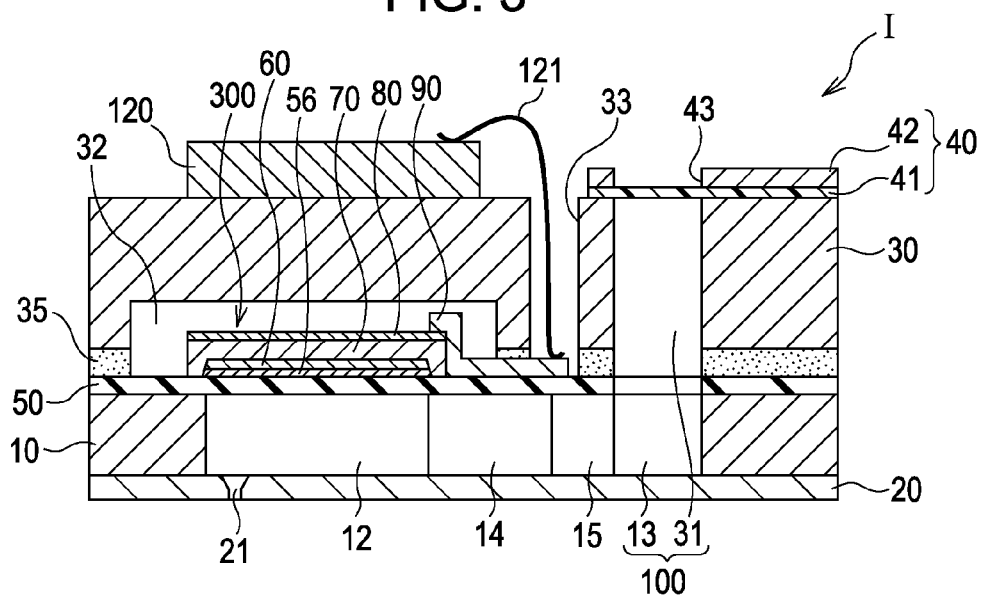
FIG. 3 is a sectional view of the recording head according to Embodiment 1.

The flow channel-forming substrate 10 has a plurality of pressure generating chambers 12 arranged in parallel in the width direction of the pressure generating chamber 12. The flow channel-forming substrate 10 also has a communicating section 13 therein located outside the pressure generating chambers 12 in the longitudinal direction of the pressure generating chambers 12. The communicating section 13 communicates with the pressure generating chambers 12 through corresponding ink supply channels 14 and communication paths 15. The communicating section 13 communicates with a manifold section 31 formed in a below-described protective substrate to define a part of a manifold acting as a common ink chamber of the pressure generating chambers 12. Each ink supply channel 14 has a smaller width than the pressure generating chamber 12, so that the flow channel resistance of the ink delivered to the pressure generating chamber 12 from the communicating section 13 is kept constant. Although the ink supply channels 14 are formed by narrowing the flow channels from one side in the present embodiment, the flow channels may be narrowed from both sides. Alternatively, the ink supply channels may be formed by reducing the depth of the flow channels, instead of narrowing the flow channels. In the present embodiment, the flow channel-forming substrate 10 has liquid flow channels including the pressure generating chambers 12, the communicating section 13, the ink supply channels 14 and the communication paths 15.

The flow channel-forming substrate 10 is joined to a nozzle plate 20 at the open side thereof with an adhesive, a thermal fusion film or the like. The nozzle plate 20 has nozzle apertures 21 communicating with portions around the ends of the corresponding pressure generating chambers 12 opposite to the ink supply channels 14. The nozzle plate 20 is made of, for example, glass-ceramic, a monocrystalline silicon substrate or stainless steel.

On the opposite side to the open side of the flow channel-forming substrate 10, the above-mentioned elastic film 50 is formed, and an adhesion layer 56 having a thickness of, for example, about 10 to 50 nm and made of titanium oxide or the like is disposed on the elastic film 50 to enhance the adhesion of the first electrode 60 with the underlying layer such as the elastic film 50. The elastic film 50 may be provided thereon with an insulating film made of zirconium oxide or the like, if necessary.

On the adhesion layer 56, piezoelectric elements 300 are formed each of which has a multilayer structure including a first electrode 60, a piezoelectric layer 70 having a small thickness of 3 μm or less, preferably 0.3 to 1.5 μm, and a second electrode 80. In the present embodiment, the piezoelectric element 300 is a pressure-generating means that makes the pressure generating chamber 12 change pressures. The piezoelectric element 300 mentioned herein refers to the portion including the first electrode 60, the piezoelectric layer 70 and the second electrode 80. In general, one of the electrodes of the piezoelectric element 300 acts as a common electrode, and the other electrode and the piezoelectric layer 70 are formed for each pressure generating chamber 12 by patterning. Although in the present embodiment, the first electrode 60 acts as the common electrode of the piezoelectric elements 300 and the second electrode 80 is provided as discrete electrodes of the piezoelectric elements 300, the functions of the first and second electrodes may be reversed for the sake of convenience of arrangement of the driving circuit and wiring. An actuator device mentioned herein is defined as a combination of the piezoelectric element 300 and a vibration plate that is displaced by the operation of the piezoelectric element 300. Although in the embodiment above, the elastic film 50, the adhesion layer 56, the first electrode 60 and, optionally, an insulating film act as a vibration plate, the vibration plate is not limited to this structure, and the elastic film 50 and the adhesion layer 56 may not be provided. The piezoelectric element 300 itself may double as a vibration plate.

In the present embodiment, the piezoelectric material forming the piezoelectric layer 70 is a complex oxide containing bismuth (Bi), iron (Fe), barium (Ba) and titanium (Ti) and having a perovskite structure. The A site of the perovskite structure, that is, the ABO3 structure, has 12 oxygen ligands, and the B site has 6 oxygen ligands to form an octahedron. Bi and Ba are present in the A site, and Fe and Ti are present in the B site.

The complex oxide containing Bi, Fe, Ba and Ti and having a perovskite structure can be represented by a complex oxide having a perovskite structure of a mixed crystal of bismuth ferrate and barium titanate or a solid solution in which bismuth ferrate and barium titanate are uniformly dissolved. Bismuth ferrate and barium titanate cannot be detected independently in an X-ray diffraction pattern.

Bismuth ferrate and barium titanate are each a known piezoelectric material having a perovskite structure, and their various compositions have been known. In addition to BiFeO3 or BaTiO3, for example, a form in which an element is provided in a short or an excessive amount, or a form in which one or some of the elements are substituted with another element is known as bismuth ferrate or barium titanate. In the present invention, bismuth ferrate and barium titanate include compositions deviated from their stoichiometric composition by partial loss or excess of one or more elements and compositions in which one or some of the elements are substituted with another element, as long as their fundamental characteristics are not changed.

The composition of the piezoelectric layer 70 made of a complex oxide having such a perovskite structure is represented as a mixed crystal expressed by the following general formula (1). Also, general formula (1) may be expressed by the following general formula (1'). General formula (1) and general formula (1') express a composition based on the stoichiometry. As long as it has a perovskite structure, the composition may be inevitably deviated by lattice mismatch, oxygen defects and so forth, or one or same of the elements may be substituted, as described above. For example, when the stoichiometric ratio is 1, an allowable range is in the range of 0.85 to 1.20.

$$(1-x)[BiFeO_3]\text{-}x[BaTiO_3] \tag{1}$$

$$(0<x<0.40)$$

$$(Bi_{1-x}Ba_x)(Fe_{1-x}Ti_x) \tag{1'}$$

$$(0<x<0.40)$$

The complex oxide forming the piezoelectric layer 70 may contain other elements in addition to Bi, Fe, Ba and Ti. Such other elements include, for example, Mn, Co and Cr. Of course, even when the complex oxide contains such other elements, the complex oxide must have a perovskite structure.

When the piezoelectric layer 70 contains Mn, Co or Cr, its complex oxide has a structure in which Mn, Co or Cr is present in the B side. For example, when Mn is contained, the complex oxide forming the piezoelectric layer 70 has a structure in which some of the Fe atoms in the solid solution containing uniformly dissolved bismuth ferrate and barium titanate are substituted with Mn atoms, or has a perovskite structure of a mixed crystal of bismuth ferrate manganate and barium titanate, and its fundamental characteristics are the same as the complex oxide having a perovskite structure of a mixed crystal of bismuth ferrate and barium titanate while it has been known that its leakage characteristics are improved. When Co or Cr is contained, the leakage characteristics are improved as in the case of Mn. Bismuth ferrate, barium titanate, bismuth ferrate manganate, bismuth ferrate cobaltate and bismuth ferrate chromate cannot be detected independently in an X-ray diffraction pattern. In the above description, cases where Mn, Co or Cr is contained are described by way of example. In addition, since it has been known that the leakage characteristics are improved in the case where two elements of other transition metal elements are simultaneously contained, such a complex oxide can be used for the piezoelectric layer 70, and other known additives may be added in order to enhance the characteristics.

The piezoelectric layer 70 made of such a complex oxide containing Mn, Co, or Cr in addition to Bi, Fe, Ba and Ti and having a perovskite structure is a mixed crystal expressed by, for example, the following general formula (2). Also, general formula (2) may be expressed by the following general formula (2'). In general formula (2) and general formula (2'), M represents Mn, Co, or Cr. General Formula (2) and general formula (2') express a composition based on the stoichiometry. As long as it has a perovskite structure, the composition may be inevitably deviated by lattice mismatch, oxygen defects and so forth, as described above. For example, when the stoichiometric composition is 1, an allowable range is in the range of 0.85 to 1.20.

$$(1-x)[Bi(Fe1-yMy)O3]-x[BaTiO3] \quad (2)$$

$$(0<x<0.40, 0.01<y<0.09)$$

$$(Bi_{1-x}Ba_x)((Fe_{1-y}M_y)_{1-x}Ti_x) \quad (2')$$

$$(0<x<0.40, 0.01<y<0.09)$$

In the present invention, the piezoelectric layer 70 has an average crystal grain diameter of 120 nm or more and 252 nm or less. The average crystal grain diameter is an average gain diameter of a crystal obtained by quadrature. More specifically, the sum of the number A of crystal grains fully present in a predetermined measurement area W (square area of 1.5 μm in length×1.5 μm in width in experimental examples in the present invention) and the product of the number B of crystal grains present on the sides of the measurement area W, multiplied by 0.5 is calculated, and the average crystal grain diameter is defined as the square root of the quotient of the measurement area W divided by the sum, A+0.5B. The equation for calculating the average crystal grain diameter is shown below.

$$\text{average crystal grain diameter} = \sqrt{\frac{W}{A+0.5B}} \quad \text{[Equation 1]}$$

Specifically, complex oxides containing Bi, Ba, Fe and Ti, as disclosed in PTL 2, are known as a piezoelectric material.

In the present embodiment, a piezoelectric layer 70 is formed of such a complex oxide containing Bi, Ba, Fe and Ti and having an average crystal grain size of 120 nm or more and 252 nm or less. Consequently, the occurrence of cracks is suppressed and the piezoelectric layer 70 has few or no cracks, as will be described in Examples and Comparative Examples. Consequently, a highly reliable ink jet recording head is provided. However, if the average crystal grain size is larger than 252 nm, cracks are liable to occur markedly.

When a complex oxide containing Bi, Ba, Fe and Ti is prepared, the average crystal grain size of the piezoelectric layer 70 can be controlled within the above-described range by adding a raw material containing Mn, Co or Cr to a precursor solution, or by varying, for example, the firing temperature, the rate of temperature increase in the firing step, or the surface roughness of the first electrode 60. This will be described in detail later.

Preferably, the piezoelectric layer 70 is preferentially oriented in the (110) plane. Such a preferential orientation allows a large distortion. The phrase "preferentially oriented in the (110) plane" used herein may imply that all the crystals are oriented in the (110) plane, or that most of the crystals (for example, 60% or more) are oriented in the (110) plane.

Each of the second electrodes 80, which are discrete electrodes provided for each piezoelectric element 300, is connected to a lead electrode 90 made of, for example, gold (Au) extending from the end of the second electrode 80 on the ink supply channel 14 side to the upper surface of the elastic film 50 and, optionally, to the upper surface of an insulating film.

A protective substrate 30 having a manifold section 31 defining at least part of a manifold 100 is joined to the flow channel-forming substrate 10 having the piezoelectric elements 300 with an adhesive 35 so as to cover the first electrode 60, the elastic film 50, an optionally provided insulating film, and the lead electrodes 90. The manifold section 31 passes through the protective substrate 30 in the thickness direction and extends along the widths of the pressure generating chambers 12. Thus, the manifold section 31 communicates with the communicating section 13 of the flow channel-forming substrate 10 to form the manifold 100 that will act as the common ink chamber of the pressure generating chambers 12. The communicating section 13 of the flow channel-forming substrate 10 may be divided for each pressure generating chamber 12, and only the manifold section 31 may serve as the manifold. Alternatively, the flow channel-forming substrate 10 may have only the pressure generating chambers 12, and the manifold 100 and ink supply channels 14 communicating with the respective pressure generating chambers 12 are formed in a member (for example, the elastic film 50, an optionally provided insulating film, etc.) between the flow channel-forming substrate 10 and the protective substrate 30.

A piezoelectric element-protecting section 32 is disposed in the region of the protective substrate 30 opposing the piezoelectric elements 300. The piezoelectric element-protecting section 32 has a space so that the piezoelectric elements 300 can operate without interference. The piezoelectric element-protecting section 32 has such a space that the piezoelectric elements 300 can operate without interference, and the space may or may not be sealed.

Preferably, the protective substrate 30 is made of a material having substantially the same thermal expansion coefficient as the flow channel-forming substrate 10, such as glass or ceramic. In the present embodiment, the protective substrate 30 is made of the same monocrystalline silicon substrate as the flow channel-forming substrate 10.

The protective substrate 30 has a through hole 33 passing through the protective substrate 30 in the thickness direction.

The ends of the lead electrodes 90 extending from the piezoelectric elements 300 are exposed in the through hole 33.

A drive circuit 120 for driving the piezoelectric elements 300 arranged in parallel is secured on the protective substrate 30. The drive circuit 120 can be, for example, a circuit board, a semiconductor integrated circuit (IC) or the like. The drive circuit 120 is electrically connected to each lead electrode 90 with a conductive connection wire 121, such as bonding wire.

Furthermore, a compliance substrate 40 including a sealing film 41 and a fixing plate 42 is joined on the protective substrate 30. The sealing film 41 is made of a flexible material having a low rigidity, and seals one end of the manifold section 31.

The fixing plate 42 is made of a relatively hard material. The portion of the fixing plate 42 opposing the manifold 100 is completely removed in the thickness direction to form an opening 43; hence the manifold 100 is closed at one end only with the flexible sealing film 41.

The ink jet recording head I of the present embodiment draws an ink through an ink inlet connected to a not-shown external ink supply means. The ink is delivered to fill the spaces from the manifold 100 to the nozzle apertures 21. Then, the ink jet recording head I applies a voltage between the first electrode 60 and each second electrode 80 corresponding to the pressure generating chambers 12, according to the recording signal from the drive circuit 120. Thus, the elastic film 50, the adhesion layer 56, the first electrode 60 and the piezoelectric layers 70 are deformed to increase the internal pressure in the pressure generating chambers 12, thereby ejecting the ink through the nozzle apertures 21.

A method for manufacturing the ink jet recording head according to the present embodiment will be described with reference to FIGS. 4 to 8. FIGS. 4 to 8 are sectional views of the pressure generating chamber taken in the longitudinal direction.

Figure 4:
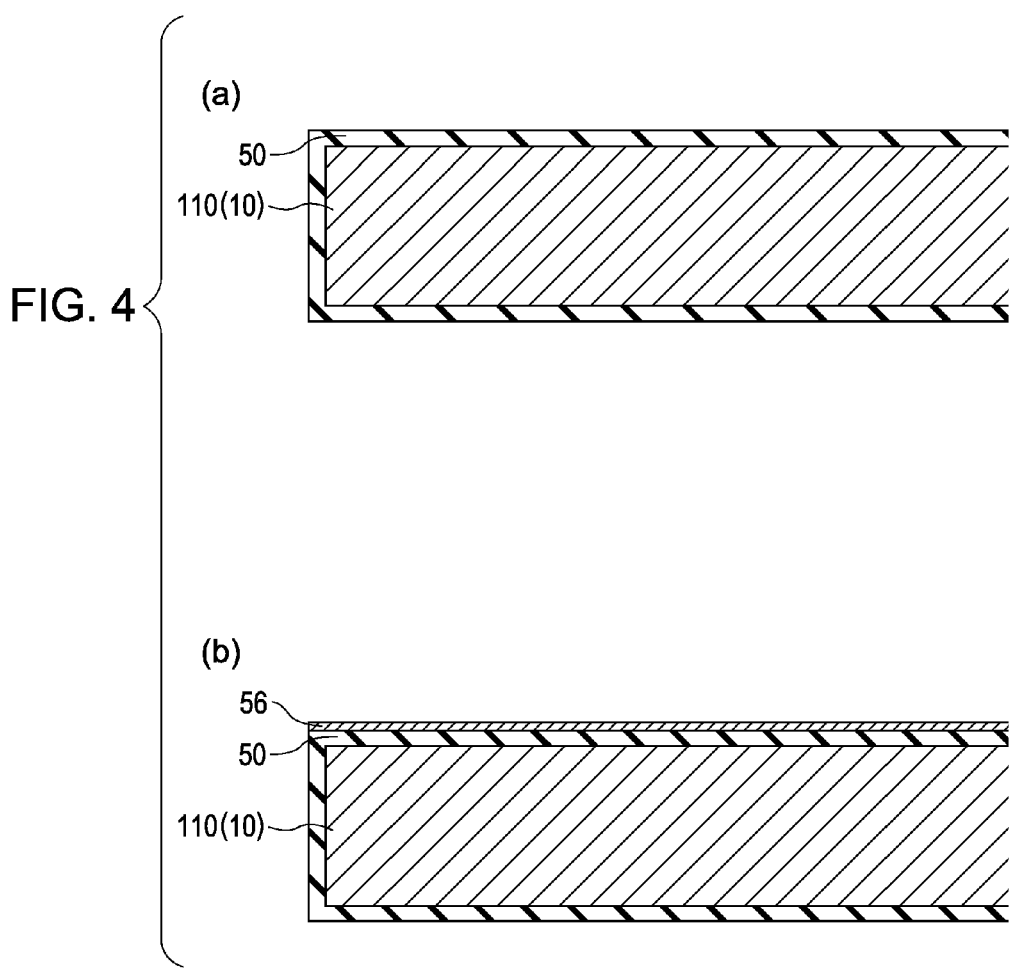
FIG. 4 is sectional views showing a manufacturing process of the recording head according to Embodiment 1.

As shown in FIG. 4(*a*), a silicon dioxide film that will form an elastic film 50 is formed of silicon dioxide (SiO2) or the like, by thermal oxidation or the like, on the surface of a flow channel-forming substrate wafer 110 that is a silicon wafer. Then, an adhesion layer 56 is formed of titanium oxide or the like on the elastic film 50 (silicon dioxide film) by sputtering, thermal oxidation or the like, as shown in FIG. 4(*b*).

Figure 5:
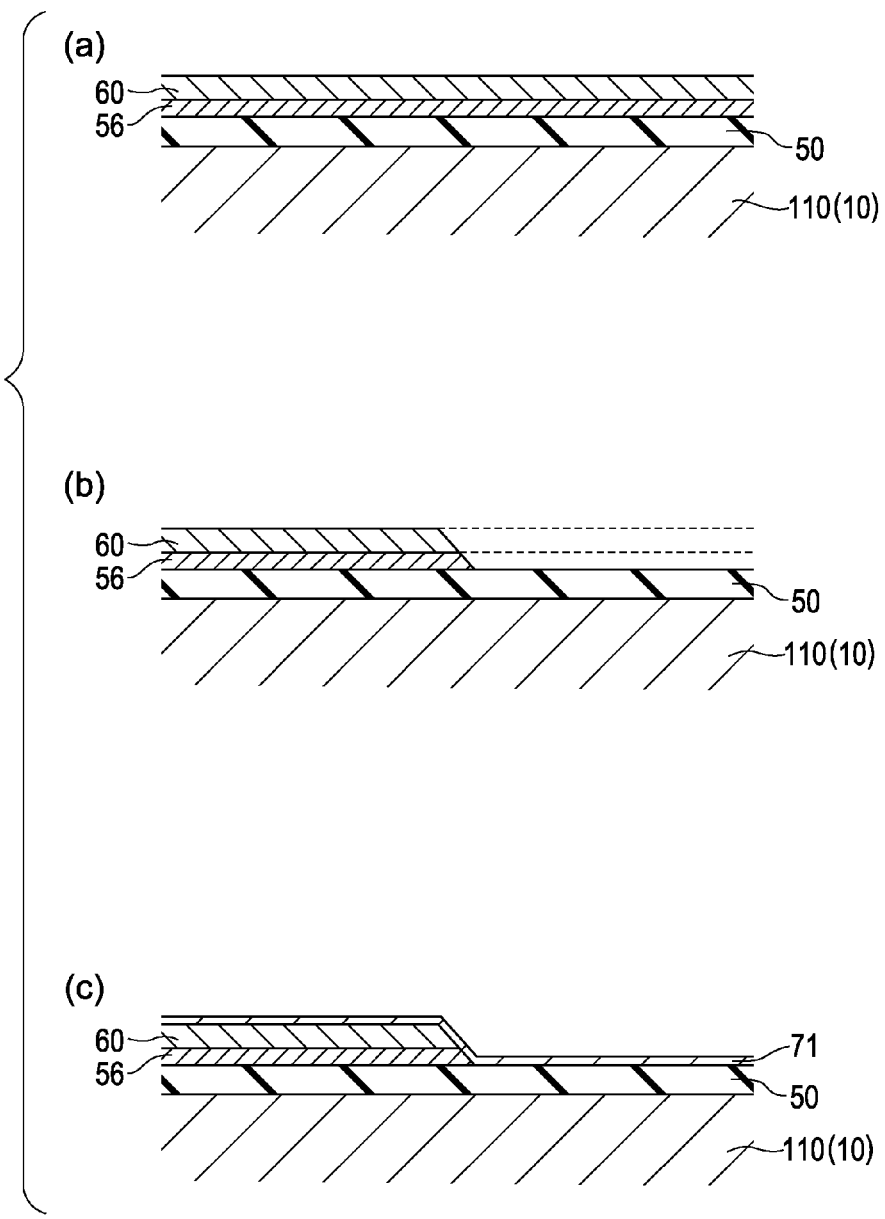
FIG. 5 is sectional views showing the manufacturing process of the recording head according to Embodiment 1.
Figure 6:
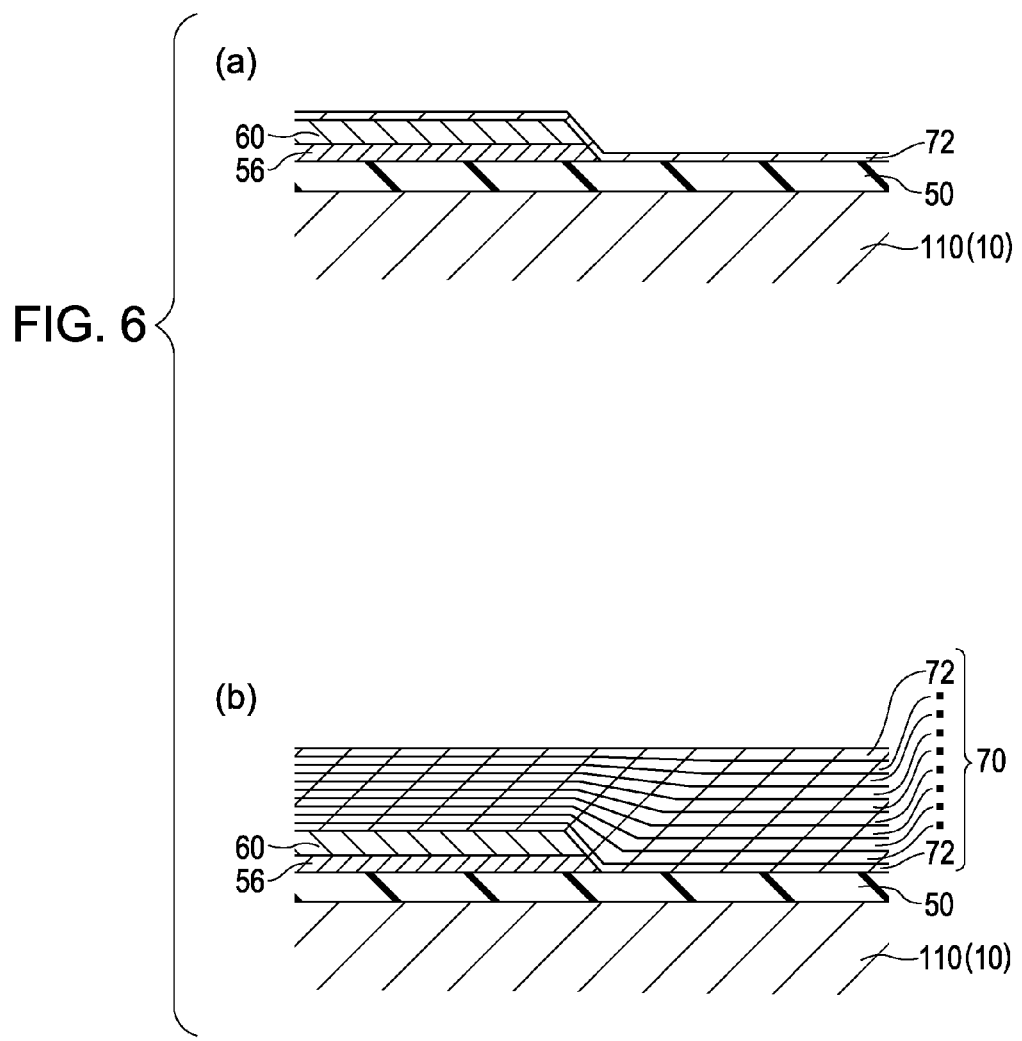
FIG. 6 is sectional views showing the manufacturing process of the recording head according to Embodiment 1.
Figure 7:
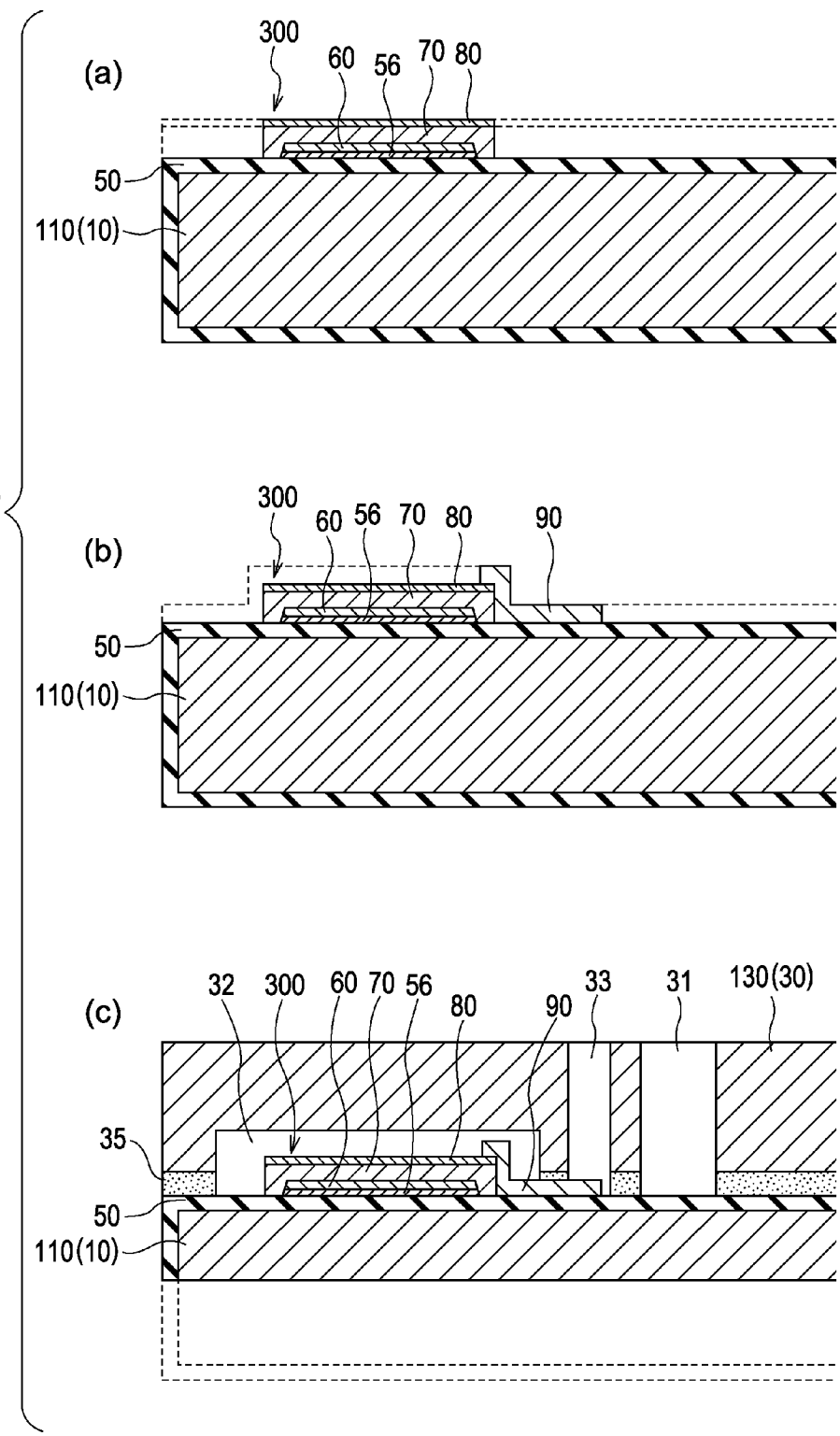
FIG. 7 is sectional views showing the manufacturing process of the recording head according to Embodiment 1.
Figure 8:
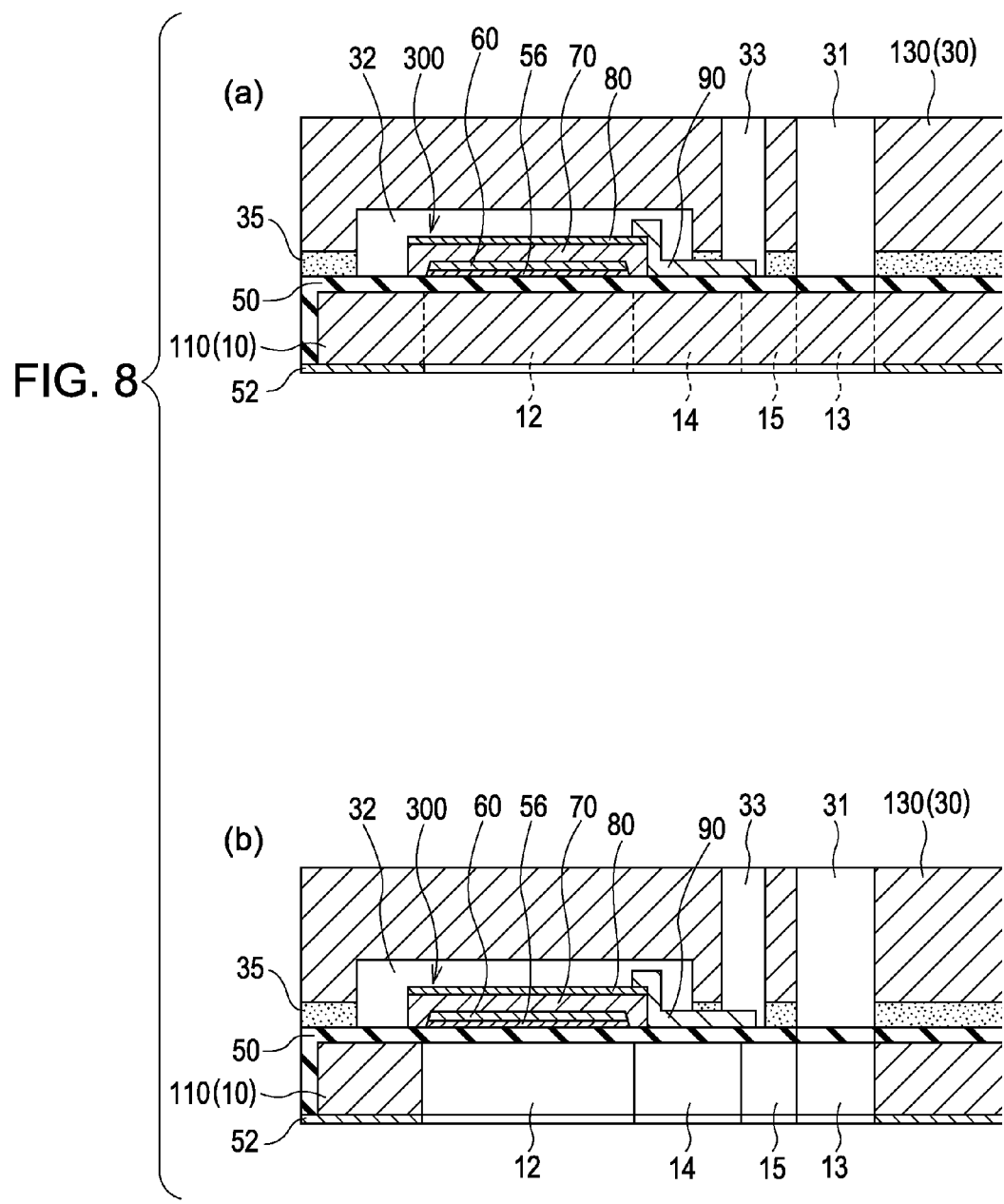
FIG. 8 is sectional views showing the manufacturing process of the recording head according to embodiment 1.

Subsequently, as shown in FIG. 5(*a*), a first electrode 60 made of platinum, iridium, iridium oxide, or a multilayer structure of these materials is formed over the entire surface of the adhesion layer 56 by sputtering, vapor deposition or the like. Then, the first electrode 60 and the adhesion layer 56 are simultaneously patterned so that their sides are inclined, using a resist (not shown) having a predetermined shape on the first electrode 60 as a mask, as shown in FIG. 5(*b*).

Then, after removing the resist, piezoelectric layers 70 are formed on the first electrode 60. The piezoelectric layer 70 may be formed by any method without particular limitation. For example, the piezoelectric layer may be formed by a chemical solution method, such as a sol-gel method or an MOD (Metal-Organic Decomposition) method in which a solution of a metal complex is applied and dried, and then crystallized by firing at a high temperature, thus forming a metal oxide piezoelectric layer (piezoelectric film). The piezoelectric layer 70 can be formed by other methods, such as laser ablation, sputtering, pulsed laser deposition (PLD), CVD or aerosol deposition, irrespective of liquid process or solid process.

More specifically, in the case where the piezoelectric layer 70 is formed by a chemical solution method, first, a piezoelectric film-forming composition (precursor solution), such as an MOD solution or a sol containing metal complexes containing Bi, Fe, Ba and Ti, is applied onto the first electrode 60 by spin coating or the like to form a piezoelectric precursor film 71, as shown in FIG. 5(*c*) (coating step).

The precursor solution to be applied is prepared by dissolving or dispersing in an organic solution a mixture of metal complexes that can form a complex oxide containing Bi, Fe, Ba and Ti by firing. If a piezoelectric layer 70 made of a complex oxide further containing Mn, Co or Cr is formed, the precursor solution further contains a metal complex containing Mn, Co or Cr. The metal complexes each containing Bi, Fe, Ba or Ti and an optionally added metal complex containing Mn, Co or Cr are mixed in such proportions as each metal has a desired molar ratio. Metal complexes each containing Bi, Fe, Ba, Ti, Mn, Co, or Cr include metal alkoxides, organic acid salts, and β-diketone complexes. Examples of the metal complex containing bismuth include bismuth octylate and bismuth acetate. Examples of the metal complex containing Fe include iron octylate, iron acetate, and iron tris(acetylacetonate). Examples of the metal complex containing Ba include barium isopropoxide, barium octylate, and barium acetylacetonate. Examples of the metal complex containing Ti include titanium isopropoxide, titanium octylate, and titanium (di-i-propoxide) bis(acetylacetonate). Examples of the metal complex containing Mn include manganese octylate and manganese acetate. Examples of the organic metal compound containing Co include cobalt octylate and cobalt (III) acetylacetonate.

The organic metal compound containing Cr may be chromium octylate. A metal complex containing two or more of Bi, Fe, Ba, Ti and an optionally added element Mn, Co or Cr can of course be used. Examples of the solvent in the precursor solution include propanol, butanol, pentanol, hexanol, octanol, ethylene glycol, propylene glycol, octane, decane, cyclohexane, xylene, toluene, tetrahydrofuran, acetic acid, and octylic acid.

Preferably, the precursor solution contains iron octylate. The use of iron octylate makes it possible to form a preferentially (110) plane-oriented piezoelectric layer 70 by natural orientation, that is, by forming a piezoelectric precursor film by coating or the like, and heating the piezoelectric precursor film to crystallize, without performing the operation of applying a magnetic field for orientation, the operation of forming a layer for controlling the orientation under the piezoelectric layer, or other operation. For preparing a precursor solution containing iron octylate, iron octylate may be added as the material of iron. Alternatively, a metal compound other than iron octylate may be used as the material of iron, and its ligands are substituted in a solvent so that the resulting precursor solution used for coating contains iron octylate. If the precursor solution contains, for example, iron tris(acetylacetonate) instead of iron octylate, a preferentially (110) plane-oriented piezoelectric layer 70 is not formed by forming a piezoelectric precursor film by coating or the like and heating the piezoelectric precursor film to crystallize.

The degree of the (110) plane orientation of the piezoelectric layer 70 can be controlled by varying the proportions of any of the elements Bi, Fe, Ba and Ti in the precursor solution, or changing the solvent or metal complexes so as to adjust the ligands of the elements.

Subsequently, the piezoelectric precursor film 71 is dried for a certain time by being heated to a predetermined temperature (for example, 150 to 200° C.) (drying step). Then, the dried piezoelectric precursor film 71 is degreased by being heated to a predetermined temperature (for example, 350 to 450° C.) and allowed to stand at that temperature for a certain time (degreasing step). The degreasing mentioned herein is performed to remove the organic components in the piezoelectric precursor film 71, for example, as NO2, CO2 or H2O. The drying step and the degreasing step may be performed in any atmosphere without particular limitation, and may be performed in the air, an oxygen atmosphere or an inert gas atmosphere. The coating step and the drying step may be performed a plurality of times.

Then, as shown in FIG. 6(a), the piezoelectric precursor film 71 is crystallized by being heated to a predetermined temperature, such as about 600 to 850° C., and keeping that temperature for a certain time, such as for 1 to 10 minutes. Thus, a piezoelectric film 72 is formed which is made of a complex oxide containing bismuth, iron, barium and titanium and having a perovskite structure (firing step). The firing step may be performed in any atmosphere without particular limitation, and may be performed in the air, an oxygen atmosphere or an inert gas atmosphere. The heating apparatus used in the drying, degreasing and firing steps may be an RTA (Rapid Thermal Annealing) apparatus using an infrared lamp for heating, or a hot plate.

As described above, by using a precursor solution containing a metal complex containing Mn, Co or Cr in addition to metal complexes containing Bi, Ba, Fe, and Ti for forming a piezoelectric layer 70 so that the complex oxide of the piezoelectric layer 70 can contain Mn, Co, or Cr in addition to Bi, Ba, Fe, or Ti and have a perovskite structure, and by controlling the manufacturing conditions to vary the firing temperature or temperature-rising rate in the firing step or to vary the surface roughness of the first electrode 60, the average crystal grain diameter of the piezoelectric layer 70 can be controlled within the above range. For example, if the firing temperature is increased, the average crystal grain diameter tends to increase. If the temperature-rising rate in the firing step is increased, the average crystal grain diameter tends to decrease, and if the temperature-rising rate is low, the average crystal grain diameter tends to increase. Since the average crystal grain diameter varies depending on each of the manufacturing conditions, it is necessary to control the balance of the manufacturing conditions.

Subsequently, the sequence of performing the coating, drying and degreasing steps, or the sequence of performing the coating, drying, degreasing and firing steps is repeated several times according to the desired thickness. Thus a piezoelectric layer 70 having a desired thickness including a plurality of piezoelectric films 72 is formed, as shown in FIG. 6(b). If, for example, a coating formed by a single application using the coating solution has a thickness of about 0.1 μm, the piezoelectric layer 70 including 10 piezoelectric films 72 has a total thickness of about 1.1 μm. Although a plurality of piezoelectric films 72 are layered in the present embodiment, a single layer may be used.

After the piezoelectric layer 70 is formed, a second electrode 80 is formed of platinum on the piezoelectric layer 70 by sputtering or the like, and the piezoelectric layer 70 and the second electrode 80 are simultaneously patterned so as to form piezoelectric elements 300, each including the first electrode 60, the piezoelectric layer 70 and the second electrode 80, in regions corresponding to the pressure generating chambers 12, as shown in FIG. 7(a). The patterning of the piezoelectric layer 70 and the second electrode 80 can be performed at one time by dry etching through a resist (not shown) having a predetermined shape. Then, annealing may be performed at a temperature of, for example, 600 to 850° C., if necessary. Thus, satisfactory interfaces can be formed between the piezoelectric layer 70 and the first electrode 60 and between the piezoelectric layer 70 and the second electrode 80, and, in addition, the crystallinity of the piezoelectric layer 70 can be improved.

Then, a lead electrode 90 is formed of, for example, gold (Au), over the entire surface of the flow channel-forming substrate wafer 110, and is patterned for each piezoelectric element 300, as shown in FIG. 7(b), through a mask pattern (not shown) made of, for example, a resist.

Then, a protective substrate wafer 130 that is a silicon wafer and will act as a plurality of protective substrates 30 is bonded to the piezoelectric element 300 side of the flow channel-forming substrate wafer 110 with an adhesive 35, and the thickness of the flow channel-forming substrate wafer 110 is reduced to a predetermined level, as shown in FIG. 7(c).

Then, as shown in FIG. 8(a), a mask film 52 is formed on the flow channel-forming substrate wafer 110 and is patterned into a predetermined shape.

Subsequently, as shown in FIG. 8(b), the flow channel-forming substrate wafer 110 is subjected to anisotropic etching (wet etching) using an alkaline solution, such as KOH, through the mask film 52 to form pressure generating chambers 12 corresponding to the piezoelectric elements 300, a communicating section 13, ink supply channels 14 and communication paths 15.

Then, unnecessary outer portions of the flow channel-forming substrate wafer 110 and protective substrate wafer 130 are cut off to be removed by, for example, dicing. Subsequently, after the mask film 52 has been removed, a nozzle plate 20 having nozzle apertures 21 therein is joined to the surface of the flow channel-forming substrate wafer 110 opposite the protective substrate wafer 130, and a compliance substrate 40 is joined to the protective substrate wafer 130. The flow channel-forming substrate wafer 110 and other substrates are cut into chips as shown in FIG. 1, each including a flow channel-forming substrate 10 and other members. Thus, the ink jet recording head I of the present embodiment is completed.

EXAMPLES

The present invention will be further described in detail with reference to Examples below. However, the invention is not limited to the following Examples.

Example 1

First, a silicon dioxide (SiO2) film was formed on a (100) monocrystalline silicon (Si) substrate by thermal oxidation. Then, a zirconium film was formed on the SiO2 film by sputtering, and the zirconium film was oxidized to form a zirconium oxide film. Then, a 40 nm thick titanium oxide layer was formed on the zirconium oxide film, and a 100 nm thick (111) plane-oriented platinum film (first electrode 60) was formed on the titanium oxide layer by sputtering.

Subsequently, a piezoelectric layer 70 was formed on the first electrode 60 by spin coating. This operation was performed as below. First, a precursor solution was prepared by mixing n-octane solutions of bismuth octylate, iron octylate, manganese octylate, barium octylate and titanium octylate so that each element satisfies the molar ratio Bi:Fe:Mn:Ba:Ti=0.75:0.7125:0.0375:0.25:0.25.

The precursor solution was dropped onto the surface of the substrate on which the titanium oxide film and the platinum film had been formed, and the substrate was rotated at 2500 rpm to form a piezoelectric precursor film (coating step). Then, the precursor film was dried at 180° C. for 3 minutes (drying step). Subsequently, degreasing was performed at 350° C. for 3 minutes (degreasing step). A process including the coating step, the drying step and the degreasing step was repeated three times. The temperature was increased to 700° C. at 50° C./minute, and firing was performed in an oxygen atmosphere at 700° C. for 5 minutes in an RTA (Rapid Thermal Annealing) apparatus (firing step). Subsequently, the sequence of performing the step of firing at one time after repeating three times the sequence of performing the coating step, drying step and degreasing step was repeated four times. Thus, a piezoelectric layer 70 was formed to a total thickness of 900 nm by 12 coating operations in total.

Then, after a 100 nm thick platinum film (second electrode 80) was formed as the second electrode 80 on the piezoelectric layer 70 by sputtering, firing was performed at 700° C. for 5 minutes in an oxygen atmosphere using an RTA apparatus. Thus, a piezoelectric element 300 including a piezoelectric layer 70 of a complex oxide containing Bi, Fe, Mn, Ba and Ti and having a perovskite structure was produced.

Examples 2 to 21 and Comparative Example 1

A piezoelectric element 300 was produced in the same manner as in Example 1 except that a precursor solution having the element ratio shown in Table 1 was prepared by mixing metal complexes in a different proportion, and the firing temperature in the firing step (represented as firing temperature in Table 1) was set to the temperature shown in Table 1.

Example 22 and Comparative Example 2

A piezoelectric element 300 was produced in the same manner as in Example 1 except that a precursor solution having the element ratio shown in Table 1 was prepared using cobalt octylate instead of manganese octylate, and the firing temperature was set to the temperature shown in Table 1.

Example 23

A piezoelectric element 300 was produced in the same manner as in Example 1 except that a precursor solution having the element ratio shown in Table 1 was prepared using chromium octylate instead of manganese octylate, and the firing temperature was set to the temperature shown in Table 1.

Experimental Example 1

Figure 9:
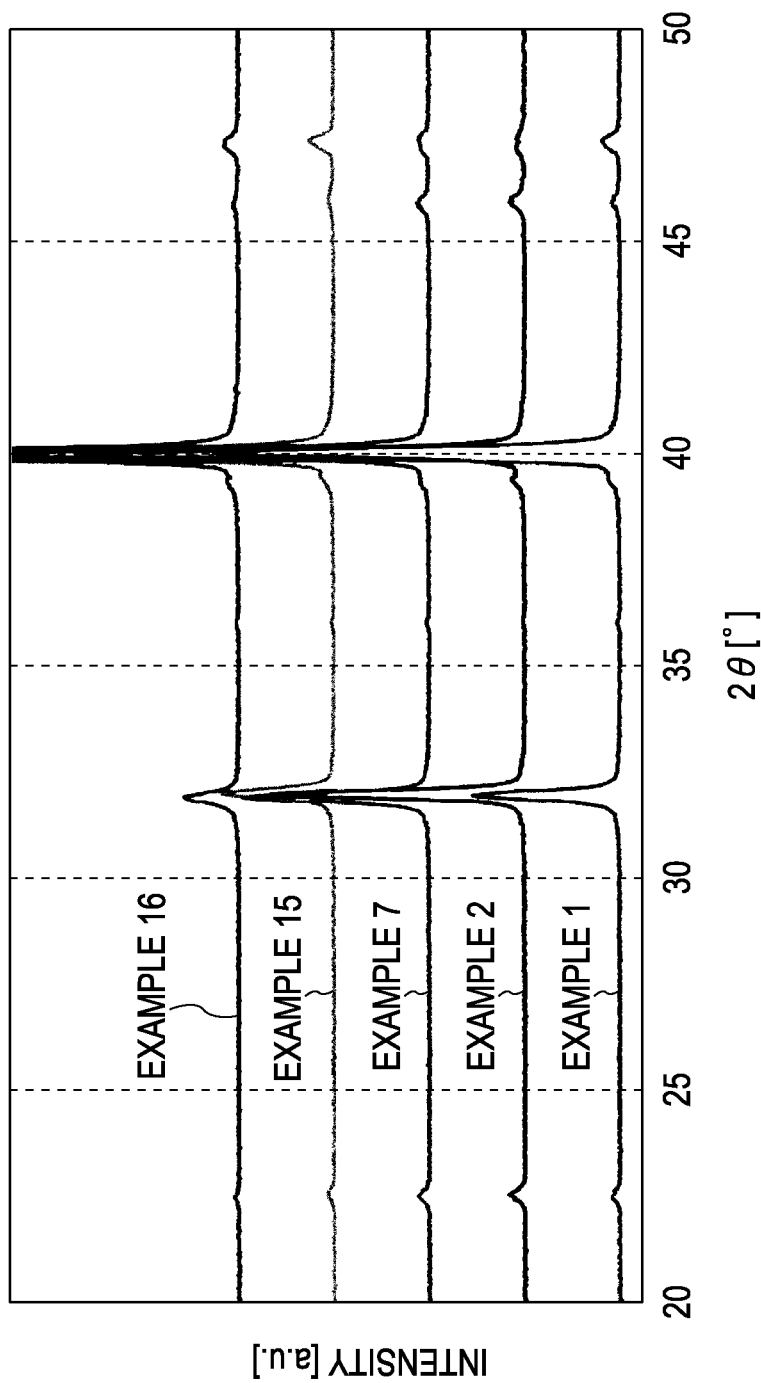
FIG. 9 is a plot of X-ray diffraction patterns of Examples and Comparative Examples.

Each of the piezoelectric elements of Examples 1 to 23 and Comparative Examples 1 and 2 was subjected to X-ray diffraction analysis to obtain the diffraction pattern of the piezoelectric layer 70 with "D8 Discover" manufactured by Bruker AXS at room temperature (25° C.), using CuKα rays as the X-ray source. An example of the results is shown in FIG. 9.

As a result, s peak derived from the perovskite structure and a peak derived from the substrate were observed in all Examples 1 to 23 and Comparative Examples 1 and 2. Also, in all Examples 1 to 23 and Comparative Examples 1 and 2, bismuth ferrate, barium titanate, bismuth ferrate manganate, cobalt ferrate manganate, and chromium ferrate manganate were not detected independently. In addition, the piezoelectric layer was preferentially oriented in the (110) plane in Examples 1 to 21 and Comparative Example 1, while it was not preferentially oriented and its orientation was random in Example 22 and Comparative Example 2.

Experimental Example 2

Figure 10:
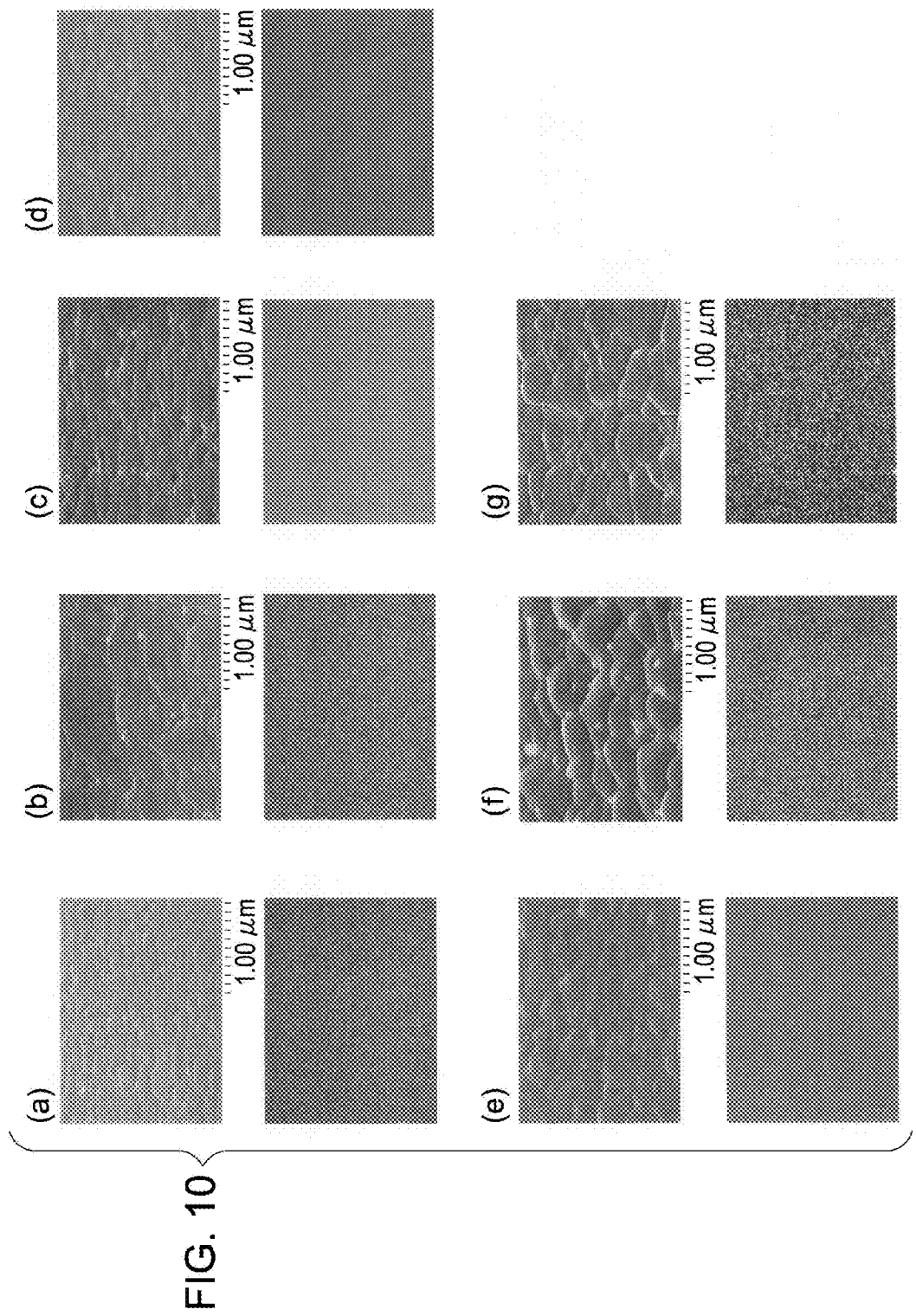
FIG. 10 is photographs of the surfaces observed in Examples and Comparative Examples.

In Examples 1 to 22 and Comparative Examples 1 and 2, the surface of the piezoelectric layer 70 immediately after being formed and before forming the second electrode 80 was observed through a scanning electron microscope (SEM) at a magnification of 50,000 times and a metallurgical microscope at a magnification of 100 times. The results are shown in Table 1 with a representation "Good" for the case where cracks were not observed or a representation "Bad" for the case where a crack was observed. Also, the results of Example 1 are shown in FIG. 10(a), the results of Example 7 are shown in FIG. 10(b), the results of Example 10 are shown in FIG. 10(c), the results of Example 15 are shown in FIG. 10(d), the results of Example 20 are shown in FIG. 10(e), the results of Comparative Example 1 are shown in FIG. 10(f), and the results of Comparative Example 2 are shown in FIG. 10(g). In each of FIGS. 10(a) to 10(g), the upper side shows the result of SEM observation and the lower side shows the result of observation through a metallurgical microscope.

Also, the average crystal grain diameter was obtained in the SEM observation by quadrature. More specifically, the sum of the number A of crystal grains fully present in the measurement area W of a square area of 1.5 μm in length×1.5 μm in width and the product of the number B of crystal grains present on the sides of the measurement area W, multiplied by 0.5 is calculated, and the average crystal grain diameter was defined as the square root of the quotient of the measurement area W divided by the sum, A+0.5B. The results are shown in Table 1.

As a result, as shown in Table 1, cracks did not occur in Examples 1 to 23, in which the average crystal grain diameters were each 120 nm or more and 252 nm or less. On the other hand, cracks occurred in Comparative Examples 1 and 2, in which the average crystal grain diameters were outside the range of 120 nm or more and 252 nm or less.

TABLE 1

| | Element molar ratio of precursor solution Bi:Fe:Mn:Co:Cr:Ba:Ti | | | | | | | Firing temperature | Average crystal grain | | |
|---|---|---|---|---|---|---|---|---|---|---|---|
| | Bi | Fe | Mn | Co | Cr | Ba | Ti | (° C.) | diameter (nm) | Orientation | Crack |
| Example 1 | 0.75 | 0.7125 | 0.0375 | 0 | 0 | 0.25 | 0.25 | 700 | 145 | (110) | Good |
| Example 2 | 0.81 | 0.7125 | 0.0375 | 0 | 0 | 0.25 | 0.25 | 700 | 169 | (110) | Good |
| Example 3 | 0.81 | 0.7125 | 0.0375 | 0 | 0 | 0.2575 | 0.25 | 700 | 234 | (110) | Good |
| Example 4 | 0.81 | 0.7125 | 0.0375 | 0 | 0 | 0.2625 | 0.25 | 700 | 191 | (110) | Good |
| Example 5 | 0.81 | 0.7125 | 0.0375 | 0 | 0 | 0.275 | 0.25 | 700 | 205 | (110) | Good |
| Example 6 | 0.81 | 0.7125 | 0.0375 | 0 | 0 | 0.30 | 0.25 | 700 | 181 | (110) | Good |
| Example 7 | 0.78 | 0.7125 | 0.0375 | 0 | 0 | 0.26 | 0.25 | 700 | 252 | (110) | Good |
| Example 8 | 0.78 | 0.7125 | 0.0375 | 0 | 0 | 0.265 | 0.25 | 700 | 217 | (110) | Good |
| Example 9 | 0.795 | 0.7125 | 0.0375 | 0 | 0 | 0.26 | 0.25 | 700 | 240 | (110) | Good |
| Example 10 | 0.7125 | 0.7125 | 0.0375 | 0 | 0 | 0.25 | 0.25 | 750 | 191 | (110) | Good |
| Example 11 | 0.675 | 0.7125 | 0.0375 | 0 | 0 | 0.25 | 0.25 | 750 | 169 | (110) | Good |
| Example 12 | 0.6375 | 0.7125 | 0.0375 | 0 | 0 | 0.25 | 0.25 | 750 | 174 | (110) | Good |

TABLE 1-continued

| | Element molar ratio of precursor solution Bi:Fe:Mn:Co:Cr:Ba:Ti | | | | | | | Firing temperature (°C.) | Average crystal grain diameter (nm) | Orientation | Crack |
| --- | --- | --- | --- | --- | --- | --- | --- | --- | --- | --- | --- |
| | Bi | Fe | Mn | Co | Cr | Ba | Ti | | | | |
| Example 13 | 0.80 | 0.76 | 0.040 | 0 | 0 | 0.20 | 0.20 | 650 | 130 | (110) | Good |
| Example 14 | 0.75 | 0.7125 | 0.0375 | 0 | 0 | 0.25 | 0.25 | 650 | 130 | (110) | Good |
| Example 15 | 0.80 | 0.76 | 0.040 | 0 | 0 | 0.20 | 0.20 | 700 | 194 | (110) | Good |
| Example 16 | 0.70 | 0.665 | 0.035 | 0 | 0 | 0.30 | 0.30 | 700 | 166 | (110) | Good |
| Example 17 | 0.80 | 0.76 | 0.040 | 0 | 0 | 0.20 | 0.20 | 750 | 240 | (110) | Good |
| Example 18 | 0.75 | 0.7125 | 0.0375 | 0 | 0 | 0.25 | 0.25 | 750 | 209 | (110) | Good |
| Example 19 | 0.70 | 0.665 | 0.035 | 0 | 0 | 0.30 | 0.30 | 750 | 178 | (110) | Good |
| Example 20 | 0.75 | 0.7125 | 0.0375 | 0 | 0 | 0.25 | 0.25 | 800 | 230 | (110) | Good |
| Example 21 | 0.70 | 0.665 | 0.035 | 0 | 0 | 0.30 | 0.30 | 800 | 192 | (110) | Good |
| Example 22 | 0.75 | 0.6975 | 0 | 0.0525 | 0 | 0.25 | 0.25 | 750 | 185 | Random | Good |
| Example 23 | 0.75 | 0.7275 | 0 | 0 | 0.0225 | 0.25 | 0.25 | 750 | 120 | (110) | Good |
| Comparative Example 1 | 0.81 | 0.7125 | 0.0375 | 0 | 0 | 0.25 | 0.25 | 800 | 354 | (110) | Bad |
| Comparative Example 2 | 0.75 | 0.7125 | 0 | 0.0375 | 0 | 0.25 | 0.25 | 750 | 265 | Random | Bad |

(Other Embodiments) Although an exemplary embodiment of the invention has been described, the invention is not limited to the above embodiment. For example, in the above embodiment, a monocrystalline silicon substrate is used as the flow channel-forming substrate 10. However, for example, an SOI substrate, glass or other materials may be used without particular limitation.

Also, although the piezoelectric element 300 of the above embodiment includes the first electrode 60, the piezoelectric layer 70 and the second electrode 80 that are stacked in that order on a substrate (flow channel-forming substrate 10), the structure is not limited to this. For example, the present invention can be applied to a vertical vibration piezoelectric element including layers of a piezoelectric material and an electrode material alternately formed so as to expand and contract in the axis direction.

Figure 11:
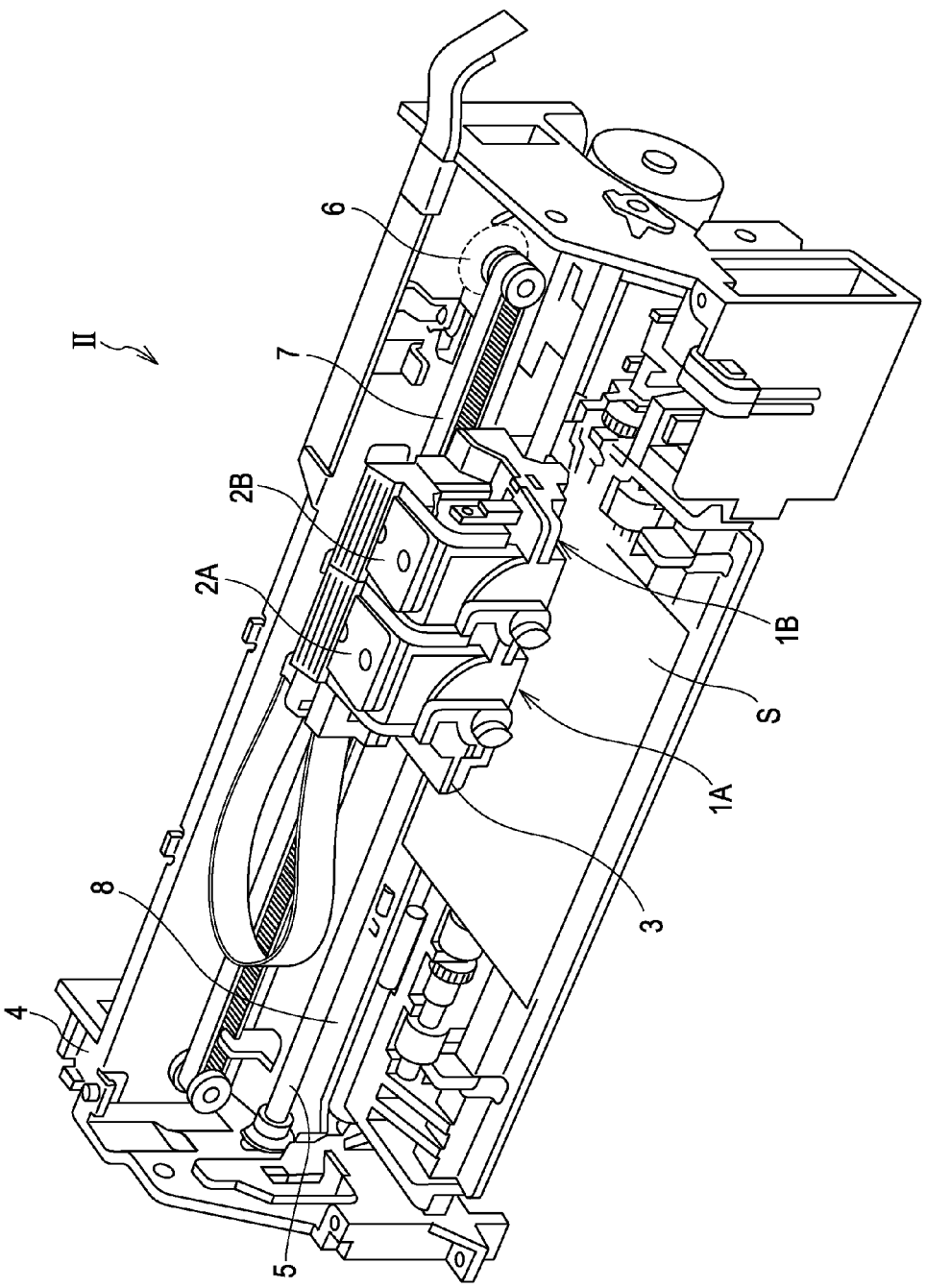
FIG. 11 is a schematic view of a recording apparatus according to an embodiment of the invention.

The ink jet recording head according to those embodiments can be installed in an ink jet recording apparatus to serve as a part of a recording head unit including an ink flow channel communicating with an ink cartridge or the like. FIG. 11 is a schematic perspective view of an example of such an ink jet recording apparatus.

The ink jet recording apparatus II shown in FIG. 11 includes recording head units 1A and 1B each including the ink jet recording head I, and cartridges 2A and 2B for supplying ink are removably mounted in the respective recoding head units 1A and 1B. The recording head units 1A and 1B are loaded on a carriage 3 secured for movement along a carriage shaft 5 of an apparatus body 4. The recording head units 1A and 1B eject, for example, a black ink composition and a color ink composition, respectively.

The carriage 3 on which the recording head units 1A and 1B are mounted is moved along the carriage shaft 5 by transmitting a driving force from a driving motor 6 to the carriage 3 through a plurality of not-shown gears and a timing belt 7. In the apparatus body 4, a platen 8 is disposed along the carriage shaft 5 so that a recording sheet S, which is a print medium such as a paper sheet fed from, for example, a not-shown feed roller, is transported over the platen 8.

Although the above embodiment has described an ink jet recording head as an example of the liquid jet head, the invention is intended for any type of liquid jet head, and may, of course, be applied to other liquid jet heads that eject liquid other than ink. Other liquid jet heads include various types of recording head used in image recording apparatuses such as printers, color material jet heads used for manufacturing color filters of liquid crystal displays or the like, electrode material jet heads used for forming electrodes of organic EL displays or FED (field emission displays), and bioorganic material jet heads used for manufacturing bio-chips.

Also, the piezoelectric element according to the present invention is not limited to the piezoelectric element used for liquid jet heads, and can be used in other devices. Examples of such other devices include ultrasonic devices, such as an ultrasonic oscillator, an ultrasonic motor, a temperature-electricity converter, a pressure-electricity converter, a ferroelectric transistor, a piezoelectric transformer, and filters, such as a cutoff filter for harmful rays such as infrared radiation, an optical filter using the photonic crystal effect of quantum dot formation, and an optical filter using optical interference of a thin film. The present invention is also applied to a piezoelectric element used as a sensor and a piezoelectric element used as a ferroelectric memory. Sensors using a piezoelectric element include, for example, an infrared sensor, a supersonic sensor, a thermal sensor, a pressure sensor, a pyroelectric sensor, and a gyro sensor (angular velocity sensor).

[Reference Signs List]

I: ink jet recording head (liquid jet head), II: ink jet recording apparatus (liquid jet apparatus), 10: flow channel-forming substrate, 12: pressure generating chamber, 13: Communicating section, 14: ink supply channel, 20: nozzle plate, 21: nozzle aperture, 30: protective substrate, 31: manifold section, 32: piezoelectric element-protecting section, 40: compliance substrate, 50: Elastic Film, 60: first electrode, 70: piezoelectric layer, 80: second electrode, 90: lead electrode, 100: manifold, 120: drive circuit, 300: piezoelectric element

The invention claimed is:

1. A liquid jet head that ejects a liquid from a nozzle aperture, the liquid jet head comprising a piezoelectric element including a piezoelectric layer and electrodes provided for the piezoelectric layer, wherein the piezoelectric layer:
   is made of a complex oxide containing bismuth, iron, barium, titanium, and further containing an element selected from manganese, cobalt, and chromium,
   has a perovskite structure, and
   has an average crystal grain diameter of 120 nm or more and 252 nm or less.

2. The liquid jet head according to claim 1, wherein the piezoelectric layer is preferentially oriented in the (110) plane.

3. A liquid jet apparatus comprising the liquid jet head as set forth in claim 1.

4. A piezoelectric element comprising a piezoelectric layer and an electrode provided for the piezoelectric layer, wherein the piezoelectric layer:
   is made of a complex oxide containing bismuth, iron, barium, titanium, and further containing an element selected from manganese, cobalt, and chromium,
   has a perovskite structure, and
   has an average crystal grain diameter of 120 nm or more and 252 nm or less.

* * * * *